(12) United States Patent
Thallner

(10) Patent No.: US 7,811,898 B2
(45) Date of Patent: Oct. 12, 2010

(54) METHOD AND DEVICE FOR BONDING WAFERS

(76) Inventor: Erich Thallner, Bubing 71, AT-4782 St. Florian (AT)

(*) Notice: Subject to any disclaimer, the term of this patent is extended or adjusted under 35 U.S.C. 154(b) by 705 days.

(21) Appl. No.: 11/545,737

(22) Filed: Oct. 10, 2006

(65) Prior Publication Data

US 2007/0087527 A1 Apr. 19, 2007

(30) Foreign Application Priority Data

Oct. 13, 2005 (EP) .................. 05022314

(51) Int. Cl.
*H01L 21/22* (2006.01)
*H01L 21/38* (2006.01)
*C04B 24/26* (2006.01)
*C08J 3/00* (2006.01)
*C08L 33/00* (2006.01)
*B28B 5/00* (2006.01)

(52) U.S. Cl. .................. 438/455; 524/523; 425/71

(58) Field of Classification Search .................. 438/455, 438/456, 457, 458, 459; 427/385.5; 524/523; 425/71; 604/104
See application file for complete search history.

(56) References Cited

U.S. PATENT DOCUMENTS

| 4,339,295 | A | 7/1982 | Boretos et al. ........... 156/275.7 |
|---|---|---|---|
| 5,421,953 | A | 6/1995 | Nagakubo et al. ............. 216/34 |
| 5,904,860 | A | 5/1999 | Nagakubo et al. ............. 216/34 |
| 6,548,176 | B1 | 4/2003 | Gwo ........................... 428/420 |
| 6,621,951 | B1 * | 9/2003 | Zhao et al. ..................... 385/30 |
| 6,905,945 | B1 | 6/2005 | Barmatz et al. ............. 438/455 |
| 2004/0009649 | A1 | 1/2004 | Kub et al. .................... 438/459 |
| 2007/0111471 | A1 * | 5/2007 | Okada ........................ 438/455 |

FOREIGN PATENT DOCUMENTS

| GB | 2 263 015 | 7/1993 |
|---|---|---|
| JP | 4-342110 | 11/1992 |

OTHER PUBLICATIONS

W.B. Choi et al., "Wafer to Wafer Direct Bonding Using Surfaces Activated by Hydrogen Plasma Treatment," ©1999, IEEE/CPMT Int'l Electronics Manufacturing Technology Symposium; p. 148.
Plößl et al., "Wafer direct bonding: tailoring adhesion between brittle materials," Materials Science and Engineering, Reports: A Review Journal, R25 (1999), pp. 1-88.

* cited by examiner

Primary Examiner—Walter L Lindsay, Jr.
(74) Attorney, Agent, or Firm—Kusner & Jaffe

(57) ABSTRACT

The invention relates to a method and a device (1) for bonding wafers (6, 9). Here at least one wafer surface is first wetted with a molecular dipolar compound, whereupon the wafers are brought into contact with each other. The bonding of the wafers then takes place by means of microwave irradiation.

13 Claims, 1 Drawing Sheet

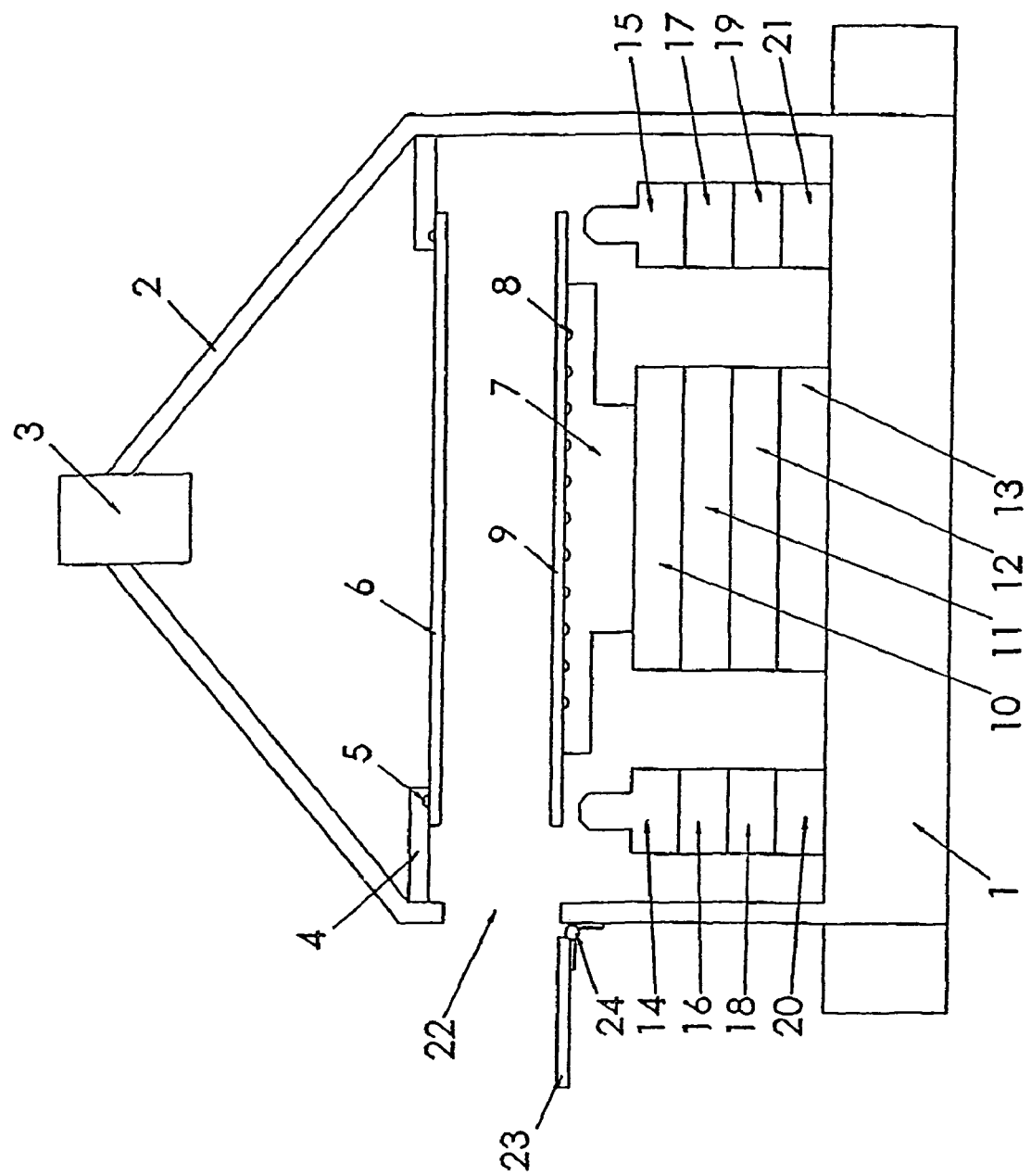

METHOD AND DEVICE FOR BONDING WAFERS

FIELD OF THE INVENTION

The invention relates to a method and a device for bonding wafers.

BACKGROUND OF THE INVENTION

In the semiconductor industry it is necessary to bond wafers together from different or even the same materials. For this purpose the wafers are normally first subjected to a cleaning stage with deionised water. After a drying stage following the cleaning stage the wafers are brought into contact with one another. The residual water molecules remaining after the drying stage ensure that the wafers already adhere to each other after they are brought into contact with each other, due to Van-der-Waals forces. After being brought into contact with each other, the wafers are introduced into an oven and heated at temperatures of up to 1000° C. or over. Due to the action of heat the wafers are bonded along the surfaces of contact to an atomic lattice which has a much greater bonding strength than the Van-der-Waals forces already acting at room temperature.

The disadvantage of the method of prior art is that the high temperatures generated may result in damage to the wafers, particularly if the wafers have already undergone different process stages. The high temperatures may, for example, result in the destruction of components located on the wafer.

In order to reduce the temperature required for bonding, attempts are already being made to pre-treat the wafer surfaces, for example by plasma activation, in order to achieve as high a bonding strength as in the conventional, temperature-intensive method even at temperatures of up to approximately 400° C.

The object of the invention is to propose a more economic method of bonding wafers and a device for bonding wafers, with which a sufficiently high bonding strength can be achieved.

This object is achieved according to the method with the features of claim 1 and according to the device with the features of claim 9. Advantageous embodiments of the invention are indicated in the independent claims.

SUMMARY OF THE INVENTION

According to the invention provision is made for the smoothly polished wafers to be brought into contact with their wafer surfaces. The prior use of at least one wafer surface to be brought into contact with a molecular dipolar compound ensures that the wafers will adhere to each other due to Van-der-Waals forces. After the wafers have been brought into contact with other the wafers or the sections of the wafers to be bonded are irradiated by means of microwaves. This excites the molecular dipolar compound to vibrate. The absorbed energy is given off from the dipolar compound as heat, which results in the heating of the wafers directly in the contacting region. This ensures that the wafers are permanently bonded to each other. The duration and the level of the microwave energy introduced may be varied according to the wafer material and required bonding strength. However, it is advantageous to select the parameters so that the wafers are generally subjected to low level heating. This can be achieved, in particular, by a short absolute irradiation time and/or by pulsed irradiation. Because microwaves are used to produce an atomic bond between the wafers to be bonded, introducing the wafers into an oven and the associated heating of all the wafers may be dispensed with. The temperature loading of the wafers is low with the method according to the invention.

Since high temperature loading of the wafers can be avoided by means of the invention, the method according to the invention and the device according to the invention are particularly suitable for bonding wafers, consisting of different materials which have a highly variable coefficient of expansion. Since the temperature of the wafers rises only slightly due to the microwave irradiation compared to treatment in the oven, the materials to be bonded expand only slightly. This ensures precisely directed bonding.

According to the invention provision is made for the microwaves used for the irradiation are electromagnetic waves from a frequency range of between 0.3 GHz and 300 GHz. The frequency of the electromagnetic waves used is preferably approximately 18 GHz. However, it may be advantageous to use electromagnetic waves within a range of 2 to 3 GHz. A frequency of approximately 2.45 GHz is preferably the aim. The molecular dipolar compound that exists between the wafers is excited to vibrations by means of the microwaves. The absorbed energy is given off in the form of heat. The use of microwaves with a frequency of approximately 2.45 GHz is advantageous since microwaves of this frequency are also used in commercially available microwave ovens, thus ensuring that the magnetrons used to generate microwaves in this frequency range can be acquired at low cost, which in turn has a positive effect on the costs of manufacturing semiconductors.

In a further development of the invention provision is advantageously made for deionised water to be used as the molecular dipolar compound between the wafers to be bonded. It is of decisive advantage for this deionised water to take the form of residual water molecules of a previous wafer cleaning and drying stage. The wafers are cleaned with deionised water before being introduced into the bonding device. The molecular residual water adhering to the wafer surface after a subsequent drying process is sufficient to bond the wafers together by means of the Van-der-Waals forces, and to generate sufficient heat for bonding the wafers during subsequent irradiation. An additional wetting stage may be advantageously dispensed with since the wafers are sufficiently hydrophilised by the cleaning process.

Bringing the wafers into contact with other preferably takes place at an ambient temperature of between 10° C. and 30° C., and more preferably at approximately 20° C.

In an embodiment of the invention provision is advantageously made for the wafers to be aligned to each other in a specific manner before they are brought into contact with each other. An adjusting device is provided for this purpose, which device at least one wafer to move in the plane, i.e. in the x- and y-direction. It is also advantageous if the adjusting device allows the rotation of at least one wafer relative to the other wafer about an axis of rotation running perpendicularly to the x-y plane.

The device according to the invention for bonding wafers includes means for bringing the wafers into contact with each other. In other words this means that the wafers can be moved towards each other by means of a device. The wafers can be brought into contact with each other almost without pressure, or with a predetermined compressive force, according to the application. Furthermore, the device comprises a microwave irradiation device. Space-charge-wave tubes are advantageously used to generate the microwaves, particularly clystrons or magnetrons.

In most cases the wafers are transmitted to retaining devices inside the device immediately after a cleaning and drying stage or a plasma treatment, and fixed there, particularly by the application of a vacuum.

In an embodiment of the invention provision is made for the device to comprise at least one adjusting device for the defined alignment of the wafers relative to each other. In particular, the adjusting device allows the displacement of at least one wafer in the plane, i.e. in the x- and y-direction. It is also advantageous for the adjusting device to allow the rotation of the wafer in the x-y plane about a fulcrum. The adjusting device advantageously comprises at least two microscopes, each with at least one CCD camera. The microscope camera units are adjusted to adjusting units which allow an adjustment in the x-, y- and z-directions. The exact position of the wafer is determined by aligning the microscopes at adjusting points of a first wafer. A second wafer is now adjusted by the adjusting device to the position of the first wafer previously approached by the microscopes and stored. The two wafers are then brought together so that physical contact is ensured. After the wafers are adjusted and brought into contact, if necessary with contact pressure, they are irradiated by means of microwaves.

Further advantages and suitable embodiments may be deduced from the further claims, the description of the FIGURE and the drawings.

BRIEF DESCRIPTION OF THE DRAWINGS

The single FIG. 1 shows a device for bonding two wafers.

DETAILED DESCRIPTION OF THE PREFERRED EMBODIMENT

Device 1 consists of a housing 2, which is designed in its upper region as a tapering hood. A microwave irradiation device 3 designed as a magnetron is located centrically in the upper region of housing 2. A first retaining device 4, consisting of a rotating ring with a vacuum groove 5, is provided inside the microwave-tight housing 2 in the lower region of the hood. A first wafer 6 can be fixed by means of first retaining device 4 by applying a vacuum to vacuum groove 5.

Underneath first wafer 6 is arranged a second retaining device 7 (chuck) which has a plurality of vacuum grooves 8. By applying a vacuum to vacuum grooves 8 a second wafer 9 can be fixed parallel to first wafer 6.

Second retaining device 7 is fixed on four adjusting devices 10, 11, 12, 13. The uppermost adjusting device 10 is used to adjust second retaining device 7 with second wafer 9 along an x-axis (see the drawn system of coordinates). Second adjusting device 11 from above is used to adjust second retaining device 7 along a y-axis. The y-axis is located in the same plane as the x-axis and runs at an angle of 90° to it. Third adjusting device 12 is used to adjust second retaining device 7 with second wafer 9 in the direction of the first wafer, i.e. in the z-direction. Both wafers 6, 9 can be brought into contact with each other by means of third adjusting device 12. The bottommost adjusting device 13 is used to rotate second retaining device 7 with second wafer 9 in the x-, y-plane. First, second and fourth adjusting devices 10, 11, 13 form part of a general adjusting device.

The adjusting device incorporates two adjustable microscopes 14, 15, arranged at a certain distance from each other, with an integrated CCD camera. Both microscope camera units 14, 15 are each mounted on three adjusting devices 16, 18, 20 and 17, 19, 21. Microscopes 14, 15 can be adjusted in the x-direction by means of uppermost adjusting devices 16, 17. Adjusting devices 18, 19 underneath them are used to adjust microscopes 14, 15 in the y-direction. Microscopes 14, 15 are adjusted in the z-direction, i.e. in the direction of first wafer 6, by means of adjusting devices 20, 21 arranged at the very bottom.

The chamber has a lateral orifice 22 for loading first and second retaining device 4, 5 with first and second wafers 6, 9. Orifice 22 can be sealed by means of a cover 23. Cover 23 is retained on housing 2 by means of a hinge 24.

The bonding process takes place as follows:

A first wafer 6 deriving directly from a cleaning and drying process or from a plasma chamber is transferred to by means of a grab, not shown, to the first annular retaining device 4, and is fixed there by means of a vacuum. After first wafer 6 is fixed, both microscopes, with integrated CCD camera, are aligned to adjusting points of first wafer 6, not shown. Adjusting devices 16, 17, 18, 19, 20, 21 are used for this purpose. The positions of the adjusting points are stored in a control unit. Second wafer 9, is then fixed in a plasma chamber on second retaining device 7 by means of a vacuum, also after a suitable cleaning and drying process or after pre-treatment. Second wafer 9 is then adjusted by means of adjusting units 10, 11, 13 to the adjusting points of first wafer 6 approached by microscopes 14, 15 and stored. At the end of this adjusting process second wafer 9 is moved towards first wafer 6 by means of third adjusting device 12, ensuring physical contact between the two wafers 6, 9. Molecular deionised residual water from the cleaning process, not explained in further detail, is present between the two wafers. Both wafers 6, 9 are held together by Van-der-Waals forces at this time. After flap 23 is closed wafers 6, 9 are irradiated for a predetermined time by means of microwave irradiation device 3. The hydrophilised surface of the wafers is excited by the introduction or this radiant energy and a permanent bond is produced.

LIST OF REFERENCE NUMBERS

1 Device
2 Housing
3 Microwave irradiation device
4 First retaining element
5 Vacuum groove
6 First wafer
7 Second retaining element
8 Vacuum grooves
9 Second wafer
10 Adjusting device x-axis
11 Adjusting device y-axis
12 Adjusting device z-axis
13 Adjusting device (rotary device)
14 Microscope with integrated CCD camera
15 Microscope with integrated CCD camera
16 Adjusting device x-axis
17 Adjusting device x-axis
18 Adjusting device y-axis
19 Adjusting device y-axis
20 Adjusting device z-axis
21 Adjusting device z-axis

The invention claimed is :

1. A method for bonding wafers (6, 9), with the following process stages:

wetting of at least one wafer surface with a molecular dipolar compound for bonding the wafers (6, 9) by means of Van-der-Waals forces during contacting of the wafers (6, 9), bringing the wafers to be bonded (6, 9) into contact with each other at an ambient temperature of between 10° C. and 30° C. after prior plasma activation of at least one wafer surface, wherein the wafers (6, 9) are subsequently irradiated by means of microwaves to permanently bond the wafers (6, 9) to each other.

2. The method according to claim 1, characterized in that the microwaves used for the irradiation are electromagnetic waves with a frequency of between 0.3 GHz and 300 GHz.

3. The method according to one of the preceding claims, characterized in that deionised water is used as the molecular dipolar compound.

4. The method according to claim 3, characterized in that the deionised water consists of residual water molecules from a preceding cleaning and drying stage.

5. The method according to claim 1 characterized in that wafers (6, 9) are bonded from the same or different materials.

6. The method according to claim 1, characterized in that the wafers (6, 9) are aligned with each other before being brought into contact.

7. A device (1) for bonding wafers (6, 9), in particular by a method of claim 1, with means (12) for bringing the wafers (6, 9) into contact with each other, characterized in that the device (1) comprises at least one microwave irradiation device (3).

8. The device according to claim 7, characterized in that a retaining device (4, 7) is provided for each wafer (6, 9).

9. The device according to claim 8, characterized in that the device (1) comprises at least one adjusting device (10, 11, 13, 14, 15, 16, 17, 18, 19, 20, 21) for the defined alignment of the wafers (6, 9) relative to each other.

10. A method of bonding wafers (6, 9) with the following process stages:
    wetting of at least one wafer surface with a molecular dipolar compound for bonding the wafers (6, 9) by means of Van-der-Waals forces during contacting of the wafers (6, 9),
    bringing the wafers to be bonded (6, 9) into contact with each other after prior plasma activation of at least one wafer surface,
    wherein the wafers (6, 9) are subsequently irradiated by means of microwaves with a frequency of about 18 GHz.

11. The method according to claim 2, wherein the frequency is about 2 to 3 GHz.

12. The method according to claim 2, wherein the frequency is about 2.45 GHz.

13. A method for bonding wafers (6, 9), with the following process stages:
    wetting of at least one wafer surface with a molecular dipolar compound for bonding the wafers (6, 9) by means of Van-der-Waals forces during contacting of the wafers (6, 9),
    bringing the wafers to be bonded (6, 9) into contact with each other at an ambient temperature of 20° C. after prior plasma activation of at least one wafer surface,
    wherein the wafers (6, 9) are subsequently irradiated by means of microwaves to permanently bond the wafers (6, 9) to each other.

* * * * *